United States Patent
Zhang et al.

(10) Patent No.: US 10,280,529 B2
(45) Date of Patent: *May 7, 2019

(54) METHOD FOR MAKING SEMIMETAL COMPOUND OF PT

(71) Applicants: Tsinghua University, Beijing (CN); HON HAI PRECISION INDUSTRY CO., LTD., New Taipei (TW)

(72) Inventors: Ke-Nan Zhang, Beijing (CN); Ming-Zhe Yan, Beijing (CN); Shu-Yun Zhou, Beijing (CN); Yang Wu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/642,412

(22) Filed: Jul. 6, 2017

(65) Prior Publication Data
US 2018/0087178 A1    Mar. 29, 2018

(30) Foreign Application Priority Data
Sep. 28, 2016  (CN) .......................... 2016 1 0862880

(51) Int. Cl.
  *C30B 9/06*    (2006.01)
  *C01B 19/00*   (2006.01)
  *C30B 25/00*   (2006.01)
  *C30B 29/46*   (2006.01)

(52) U.S. Cl.
  CPC .............. *C30B 9/06* (2013.01); *C01B 19/007* (2013.01); *C30B 25/00* (2013.01); *C30B 29/46* (2013.01); *C01P 2002/72* (2013.01); *C01P 2002/82* (2013.01); *C01P 2004/01* (2013.01); *C01P 2004/60* (2013.01)

(58) Field of Classification Search
  CPC .............. C01B 19/007; C01P 2002/72; C01P 2002/82; C01P 2004/01; C01P 2004/60; C30B 25/00; C30B 29/46; C30B 9/06
  See application file for complete search history.

(56) References Cited

PUBLICATIONS

W.O.J. Groeneveld Meijer, "Synthesis, structures, and properties of platinum metal tellurides," American Mineralogist, vol. 40, pp. 646-657. (Year: 1995).*

* cited by examiner

*Primary Examiner* — Hua Qi
(74) *Attorney, Agent, or Firm* — ScienBiziP, P.C.

(57) ABSTRACT

The disclosure relates to a method for making semimetal compound of Pt. The semimetal compound is a single crystal material of $PtSe_2$. The method comprises: placing pure Pt and pure Se in a reacting chamber as reacting materials; evacuating the reacting chamber to be vacuum less than 10 Pa; heating the reacting chamber to a first temperature of 600 degrees Celsius to 800 degrees Celsius and keeping for 24 hours to 100 hours; cooling the reacting chamber to a second temperature of 400 degrees Celsius to 500 degrees Celsius and keeping for 24 hours to 100 hours at a cooling rate of 1 degrees Celsius per hour to 10 degrees Celsius per hour to obtain a crystal material of $PtSe_2$; and separating the excessive reacting materials from the crystal material of $PtSe_2$.

8 Claims, 19 Drawing Sheets

US 10,280,529 B2

METHOD FOR MAKING SEMIMETAL COMPOUND OF PT

CROSS-REFERENCE TO RELATED APPLICATIONS

This application claims all benefits accruing under 35 U.S.C. § 119 from China Patent Application No. 201610862880.2, filed on Sep. 28, 2016, in the China Intellectual Property Office, the disclosure of which is incorporated herein by reference. This application is related to applications entitled, "SEMIMETAL COMPOUND OF Pt AND METHOD FOR MAKING THE SAME", filed on Jul. 6, 2017 with application Ser. No. 15/642,406.

BACKGROUND

1. Technical Field

The present disclosure relates to a semimetal compound of Pt and method for making the same.

2. Description of Related Art

Three-dimensional semimetals are important hosts to exotic physical phenomenon such as giant diamagnetism, linear quantum magnetoresistance, and quantum spin Hall effect. Three dimensional Dirac fermions can be viewed as three dimensional version of graphene and have been realized in Dirac semimetals.

$Cd_3As_2$, $Na_3Bi$, $K_3Bi$, and $Rb_3Bi$ are found as three-dimensional Dirac semimetals. However, all the $Cd_3As_2$, $Na_3Bi$, $K_3Bi$, and $Rb_3Bi$ are type-I Dirac semimetals having a vertical cone of electron energy band as shown in FIG. 1. The type-I Dirac semimetals shows spin degenerate conical dispersions that cross at isolated momenutum points (Dirac points) in three dimensional momentum space. In a topological Dirac semimetal, the massless Dirac fermions are stabilized by crystal symmetry and could be driven into various topological phases. When breaking the inversion or time-reversal symmetry, the doubly de-generate Dirac points can be split into a pair of Weyl points with opposite chiralities, and a Dirac fermion splits into two Weyl fermions. Weyl fermions were originally proposed in high energy physics, and their condensed matter physics counterparts have been recently realized. Weyl semimetals exhibit intriguing properties, with open Fermi arcs connecting the Weyl points of opposite chiralities. Both Dirac and Weyl semimetals obey Lorentz invariance and they exhibit anomalous negative magnetoresistance.

Recently, a new type of Weyl semimetal (type-II Dirac semimetals) have been predicted. In type-II Dirac semimetals, the Weyl points arise from the topologically protected touching points between electron and hole pockets, and there are finite density of states at the Fermi level. Type-II Dirac semimetals have strongly tilted cone and thus violate the Lorantzian invariance. However, so far, the spin-degenerate counterpart of type-II Dirac semimetals have not been realized.

What is needed, therefore, is a type-II Dirac semimetals and method for making the same that overcomes the problems as discussed above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
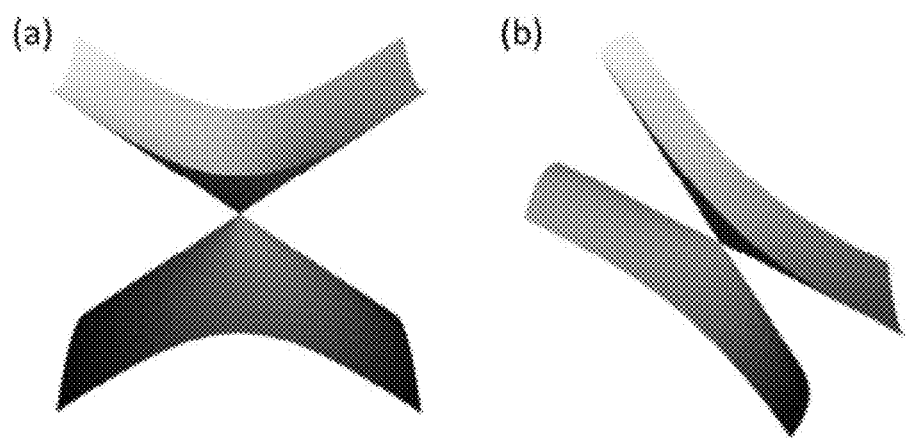
FIG. 1 is a schematic section views of electron energy band of type-I Dirac semimetal and type-II Dirac semimetal.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present type-II Dirac semimetals and method for making the same.

EXAMPLE I

Figure 2:
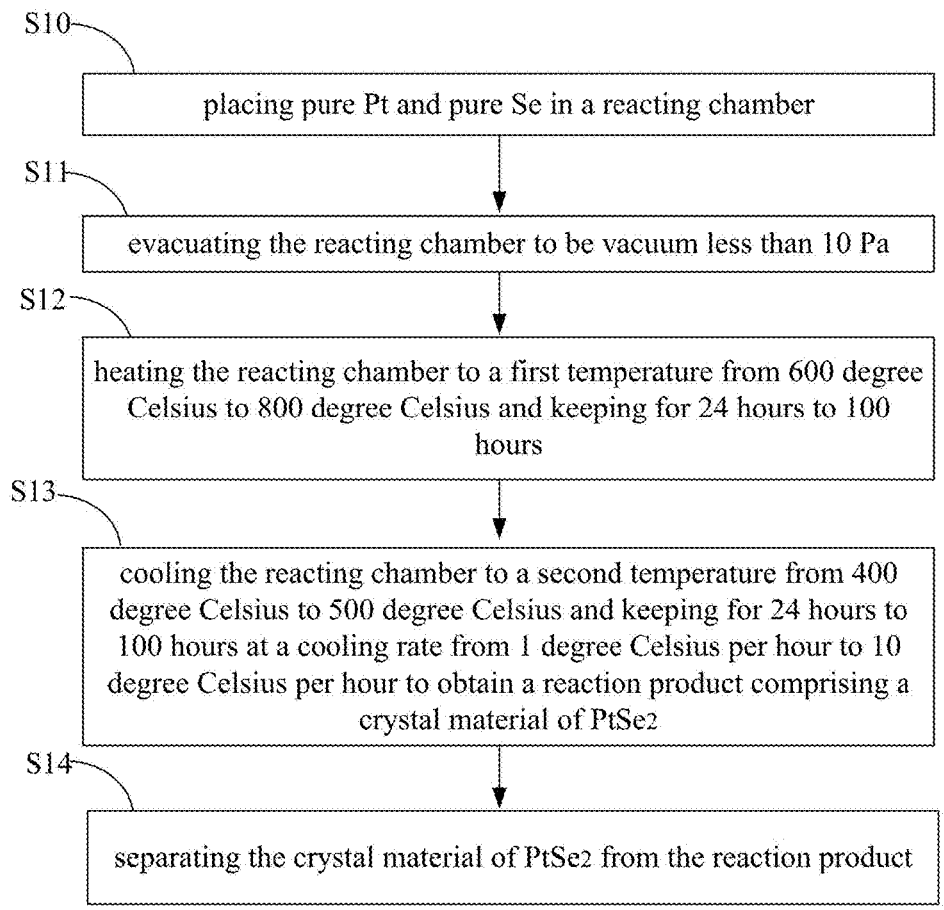
FIG. 2 is a flowchart of example I of a method for making a semimetal $PtSe_2$.
Figure 3:
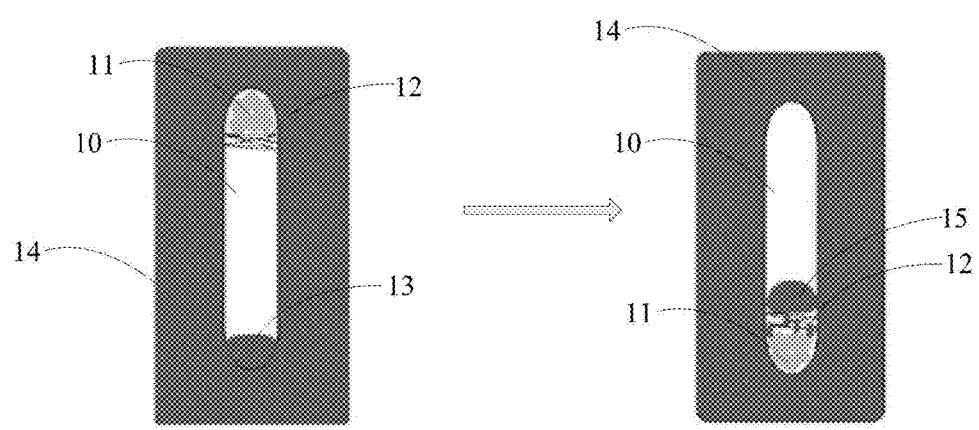
FIG. 3 is a schematic section view of example I of a device for making a semimetal $PtSe_2$.

Referring to FIGS. 2-3, a self-flux method for making the semimetal $PtSe_2$ comprises following steps:
- step (S10), placing pure Pt and pure Se in a reacting chamber 10 as reacting materials 13;
- step (S11), evacuating the reacting chamber 10 to be vacuum less than 10 Pa;
- step (S12), heating the reacting chamber 10 to a first temperature of 600 degrees Celsius to 800 degrees Celsius and keeping the first temperature for a period of about 24 hours to about 100 hours;
- step (S13), cooling the reacting chamber 10 to a second temperature of 400 degrees Celsius to 500 degrees Celsius and keeping the second temperature for a period of about 24 hours to about 100 hours at a cooling rate from about 1 degrees Celsius per hour to about 10 degrees Celsius per hour to obtain a reaction product 15 comprising a crystal material of $PtSe_2$; and
- step (S14), separating the crystal material of $PtSe_2$ from the reaction product 15.

In step (S10), the reacting chamber 10 is a quartz tube having an open end and a sealed end opposite to the open end. The quartz tube is filled with quartz slag 11 so that the quartz slag 11 form a support at the sealed end. The support has a thickness in a range of about 0.5 centimeter to about 3 centimeters. In one embodiment, the thickness of the support is about 2 centimeters. The particle diameter of the quartz slag 11 is less than 1 millimeter. The inner diameter of the quartz tube is about 8 millimeters, and the outer diameter of the quartz tube is about 10 millimeters. The quartz tube is further filled with quartz wool 12 so that the quartz wool 12 forms a filter on the quartz slag 11. The filter has a thickness in a range of about 0.5 centimeter to about 2 centimeters. In one embodiment, the thickness of the filter is about 1 centimeter. The diameter of the quartz wool 12 can be in a range of about 1 micrometer to about 10 micrometers. In one embodiment, the diameter of the quartz wool 12 is about 4 micrometers. The quartz slag 11 and the quartz wool 12 separate the crystal material of $PtSe_2$ from the reaction product 15. The quartz slag 11 and the quartz wool 12 are optional. If the quartz slag 11 and the quartz wool 12 are omitted, the reaction product 15 should be separated by special method, such as using a metal filter or ceramic filter. The pure Pt and pure Se are filled in the quartz tube after the quartz tube is filled with the quartz slag 11 and the quartz wool 12. The molar ratio of Pt element and Se element is about 2:80~2:120. In one embodiment, the moral ration is Pt:Se=2:98. The pure Pt and pure Se form the reacting materials 13. The purity of pure Pt is greater than 99.9%, and the purity of pure Se is greater than 99.99%.

In step (S11), the quartz tube is evacuated by a mechanical pump and then the open end of the quartz tube is sealed by fast heating the open end by a flame of natural gas and oxygen gas. In one embodiment, the pressure of the quartz tube can be less than 1 Pa. The natural gas can be replaced by propane gas or hydrogen gas.

In step (S12), the quartz tube is reversed and vertically located so that the reacting materials 13 is located at the bottom of the quartz tube, and the quartz slag 11 and the quartz wool 12 are located at the top of the quartz tube. The quartz tube is further accommodated in a steel sleeve 14. The fire-resistant cotton is filled between the quartz tube and the steel sleeve 14 to fix and keep the temperature of the reaction product 15 in the quartz tube.

The steel sleeve 14, having the quartz tube therein, is placed in a muffle furnace. The quartz tube is heated by the muffle furnace to a point where the inside thereof reaches 700 degrees Celsius and kept at 48 hours at 700 degrees Celsius in the muffle furnace. During heating, the reacting materials 13 is kept at the bottom of the quartz tube and the quartz slag 11 and the quartz wool 12 are kept at the top of the quartz tube. The quartz tube can also be heated by other heating device rather than muffle furnace.

In step (S13), in one embodiment, the muffle furnace is cooled down to 480 degrees Celsius at a cooling rate of 5 degrees Celsius per hour and kept at 48 hours at 480 degrees Celsius to obtain the reaction product 15. The reaction product 15 includes the crystal material of $PtSe_2$ and the excess reacting materials. The cooling rate can be in a range of about 1 degrees Celsius per hour to about 10 degrees Celsius per hour.

In step (S14), the steel sleeve 14, having the quartz tube therein, is taken out of the muffle furnace. Then the steel sleeve 14 is reversed and vertically located so that the quartz slag 11 and the quartz wool 12 are located at the bottom of the quartz tube, and the reaction product 15 is filed by the quartz wool 12. Thus, the excess reacting materials are separated from the crystal material of $PtSe_2$.

Furthermore, the steel sleeve 14, having the quartz tube therein, can be centrifuged for a period in a range of about 1 minute to about 5 minutes at a speed in a range of about 2000 rpm to about 3000 rpm. In one embodiment, the centrifuged period is about 2 minutes, and the centrifuged speed is about 2500 rpm. The excessive reacting materials can also be separated from the crystal material of $PtSe_2$ by other methods after the reaction product 15 is taken out of the quartz tube.

The quartz tube is taken out of the steel sleeve 14 after natural cooling. Then the crystal material of $PtSe_2$ is taken out of the quartz tube, washed by chemical reagent to remove residual Se element, and then rinsed by water to obtain pure crystal material of $PtSe_2$. The chemical reagent can be hydrogen peroxide, dilute hydrochloric acid, sodium hydroxide.

Figure 4:
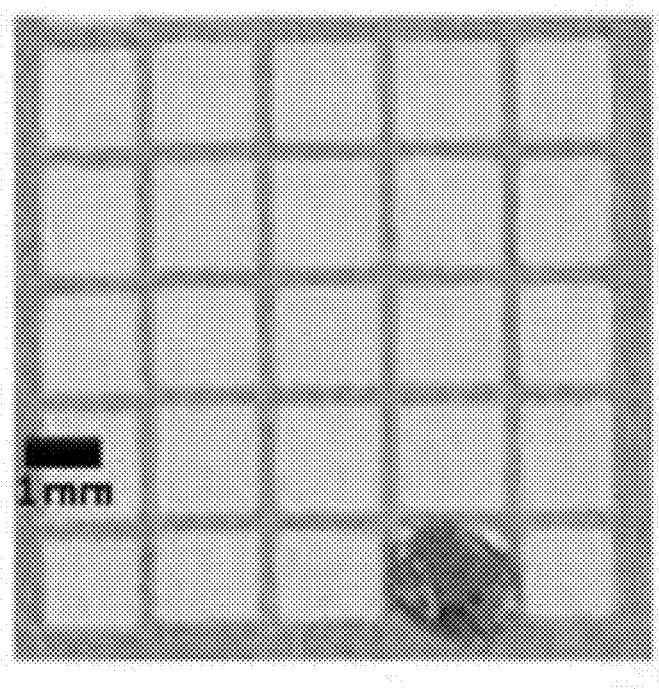
FIG. 4 is a photo image of the semimetal $PtSe_2$ of example I.
Figure 5:
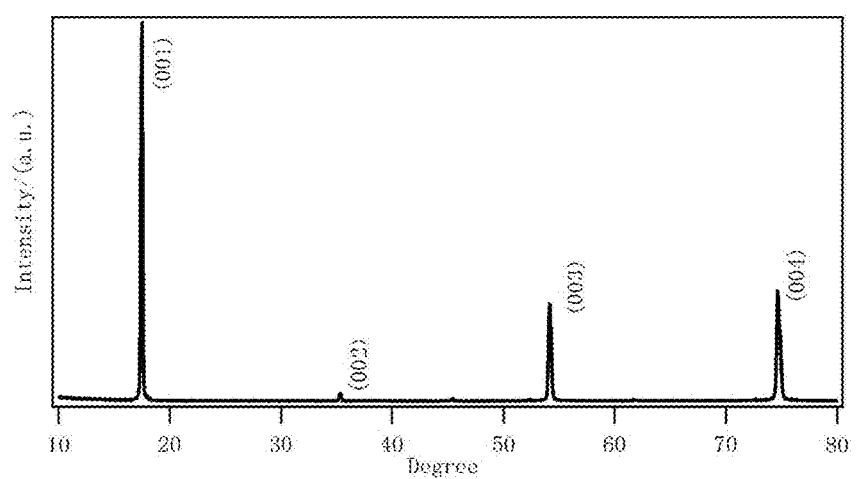
FIG. 5 is a X-ray diffraction (XRD) result of the semimetal $PtSe_2$ of example I measured at room temperature.
Figure 6:
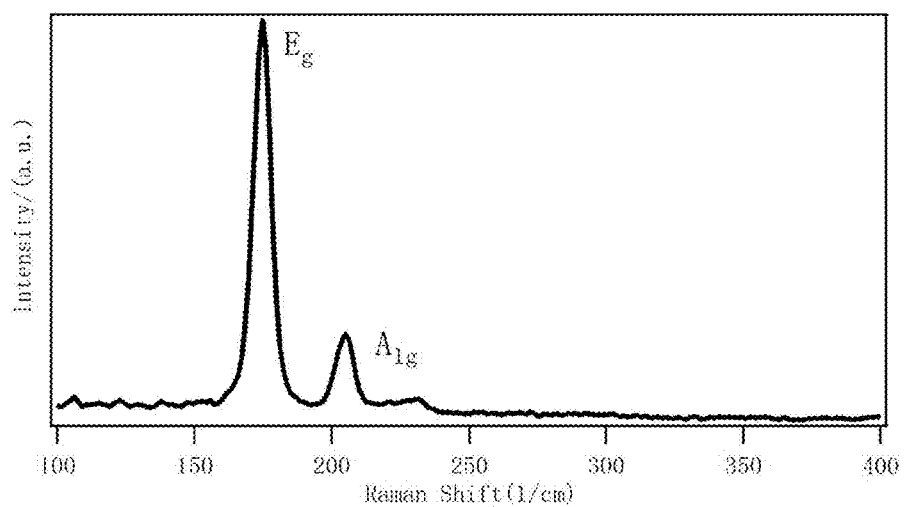
FIG. 6 is a Raman spectrum result of the semimetal $PtSe_2$ of example I measured at room temperature.
Figure 7:
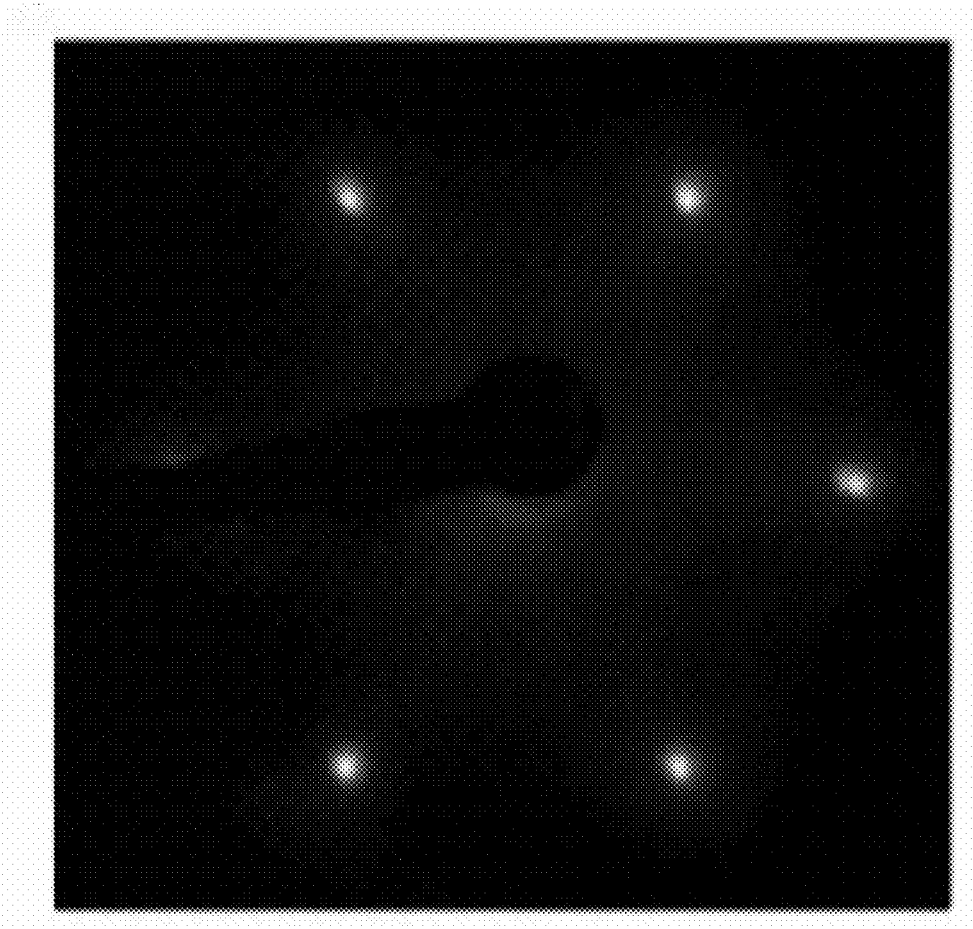
FIG. 7 is a low energy electron diffraction (LEED) pattern of the semimetal $PtSe_2$ of example I taken at beam energy of 70 eV.

The pure crystal material of $PtSe_2$ of example I was tested. FIG. 4 is a photo image of the semimetal $PtSe_2$ of example I. As shown in FIG. 4, the semimetal $PtSe_2$ of example I is macroscopic visible and has a length about 2 millimeters and a thickness about 10 micrometers to about 100 micrometers. FIG. 5 is a XRD result of the semimetal $PtSe_2$ of example I measured at room temperature of about 15 degrees Celsius to about 25 degrees Celsius. FIG. 6 is a Raman spectrum of the semimetal $PtSe_2$ of example I measured at room temperature. FIG. 7 is a LEED pattern of the semimetal $PtSe_2$ of example I taken at beam energy of 70 eV. As shown in FIGS. 5 and 7, the semimetal $PtSe_2$ of example I confirm the high quality of the single crystals. As shown in FIG. 7, the semimetal $PtSe_2$ of example I has a symmetrical structure. The Raman spectrum in FIG. 6 shows Eg and A1g vibrational modes of the semimetal $PtSe_2$ of example I at about 170 cm$^{-1}$ and 210 cm$^{-1}$ respectively, which are typical for 1T structure.

Figure 8:
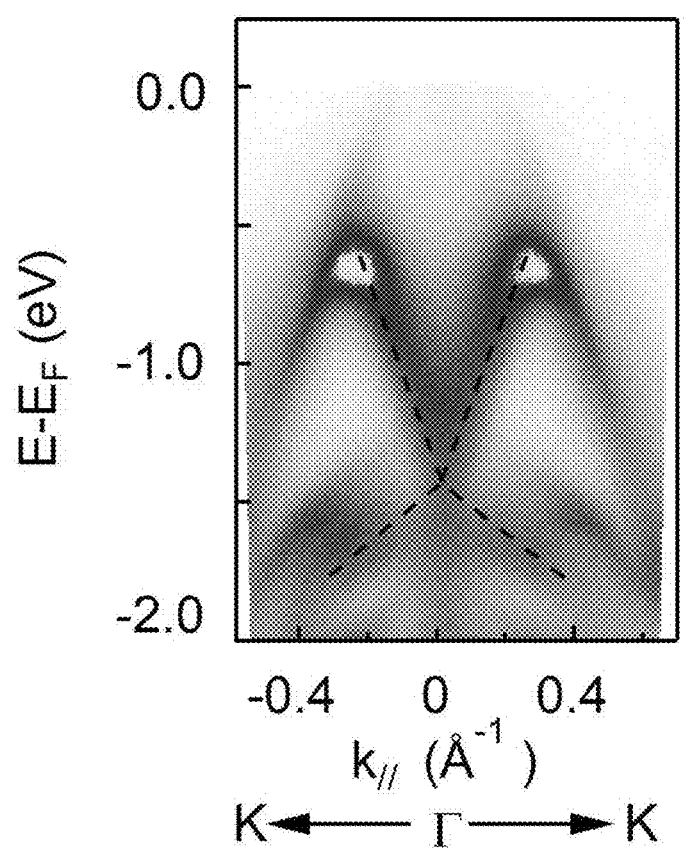
FIG. 8 shows a measured in-plane two-dimensional Dirac cone of the semimetal $PtSe_2$ of example I.
Figure 9:
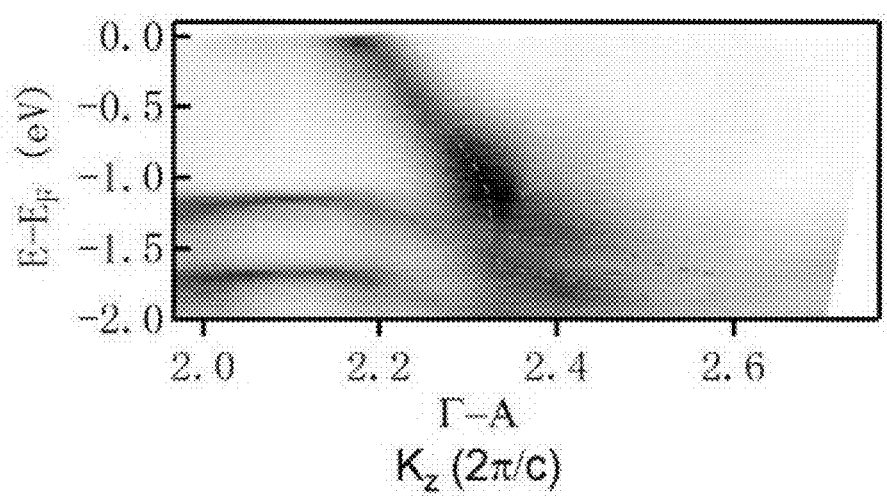
FIG. 9 shows a measured out-plane two-dimensional Dirac cone of the semimetal $PtSe_2$ of example I.
Figure 10:
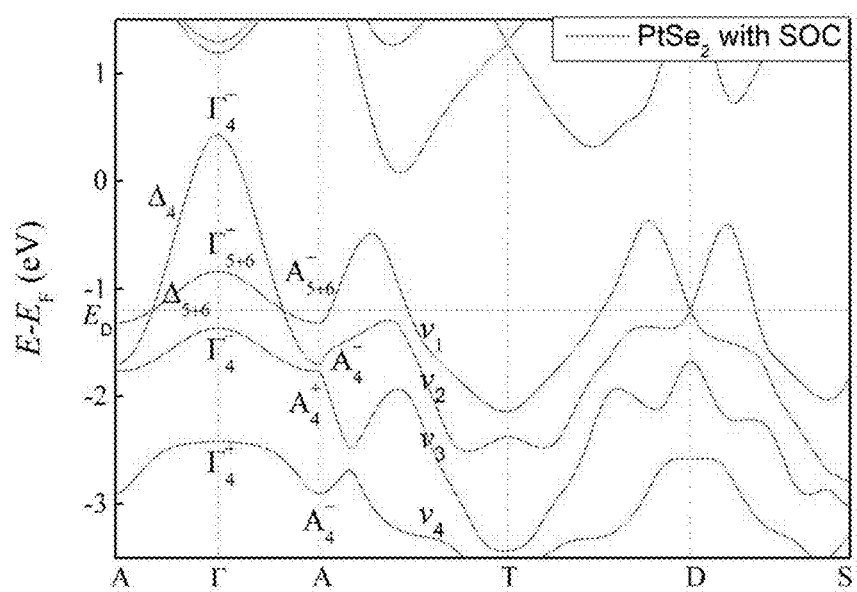
FIG. 10 shows a calculated simulation result of two-dimensional Dirac cone of the single crystal semimetal $PtSe_2$.
Figure 11:
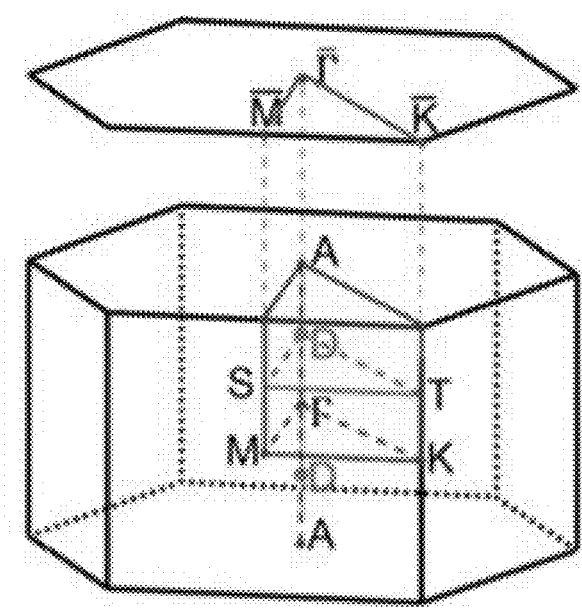
FIG. 11 shows a Brillouin zone of the semimetal $PtSe_2$ of example I.
Figure 12:
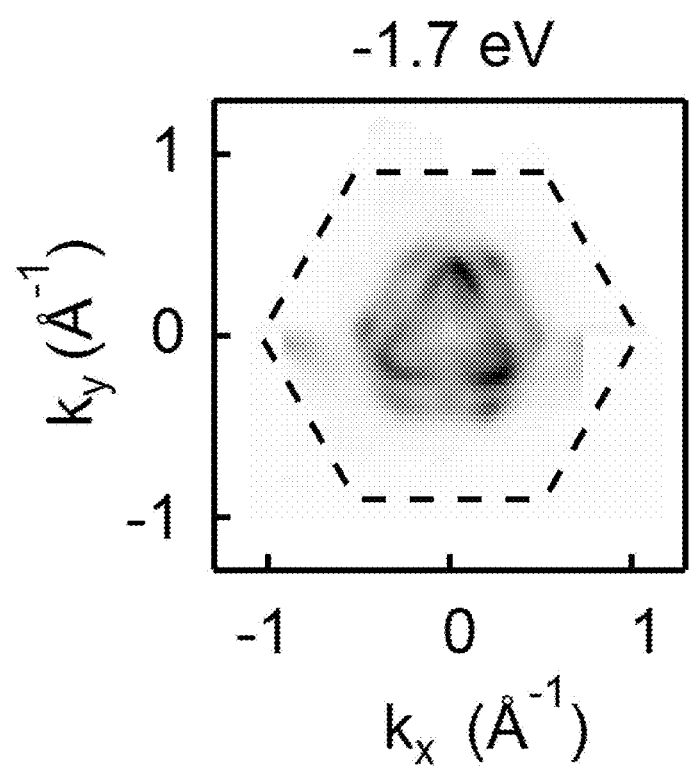
FIG. 12 shows a measured three-dimensional Dirac cone of the semimetal $PtSe_2$ of example I.
Figure 13:
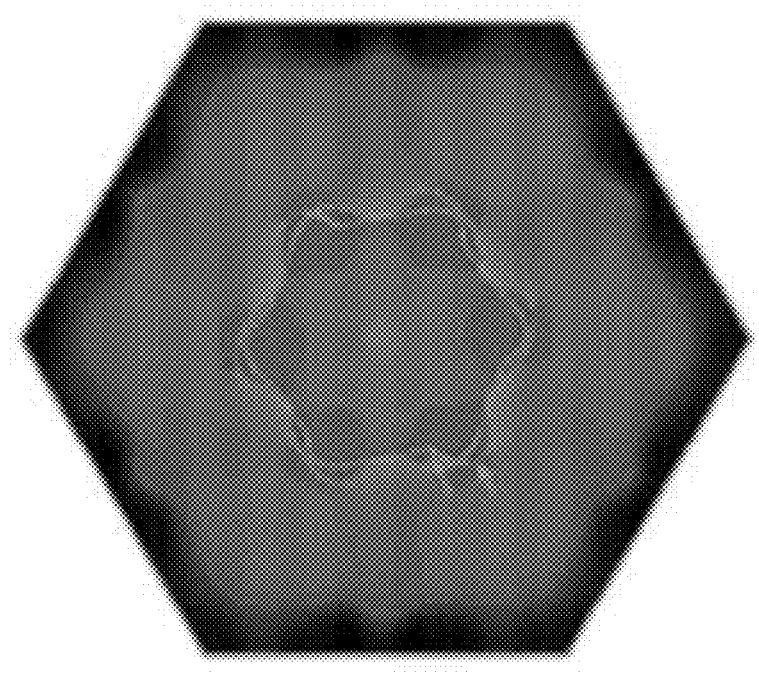
FIG. 13 shows a calculated simulation result of three-dimensional Dirac cone of the single crystal semimetal $PtSe_2$.

FIG. 8 shows a measured in-plane two-dimensional Dirac cone of the semimetal $PtSe_2$ of example I measured at 22 eV. FIG. 9 shows a measured out-plane two-dimensional Dirac cone of the semimetal $PtSe_2$ of example I measured at 22 eV. FIG. 10 shows a calculated simulation result of two-dimensional Dirac cone of the single crystal semimetal $PtSe_2$. FIG. 11 shows a Brillouin zone of the semimetal $PtSe_2$ of example I. FIG. 12 shows a measured three-dimensional Dirac cone of the semimetal $PtSe_2$ of example I. FIG. 13 shows a calculated simulation result of three-dimensional Dirac cone of the single crystal semimetal $PtSe_2$. As shown in FIGS. 8-13, it is experimentally and theoretically confirmed that the semimetal $PtSe_2$ of example I belong to Type-II Dirac semimetals.

The semimetal $PtSe_2$ of example I has physical properties such as negative magnetoresistance, quantum spin Hall effect, and linear quantum magnetoresistance. As Type-II Dirac semimetals, the semimetal $PtSe_2$ of example I exhibits anomalous negative magnetoresistance.

EXAMPLE II

Figure 14:
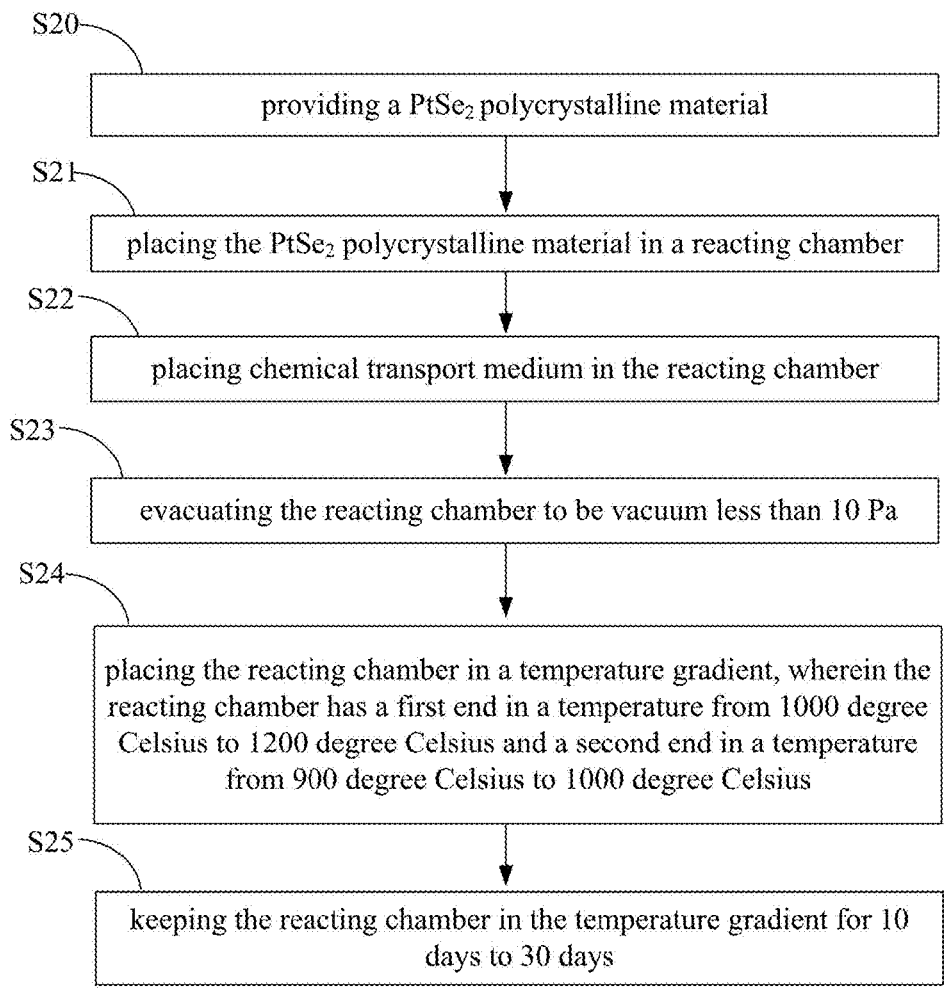
FIG. 14 is a flowchart of example II of a method for making a semimetal $PtSe_2$.
Figure 15:
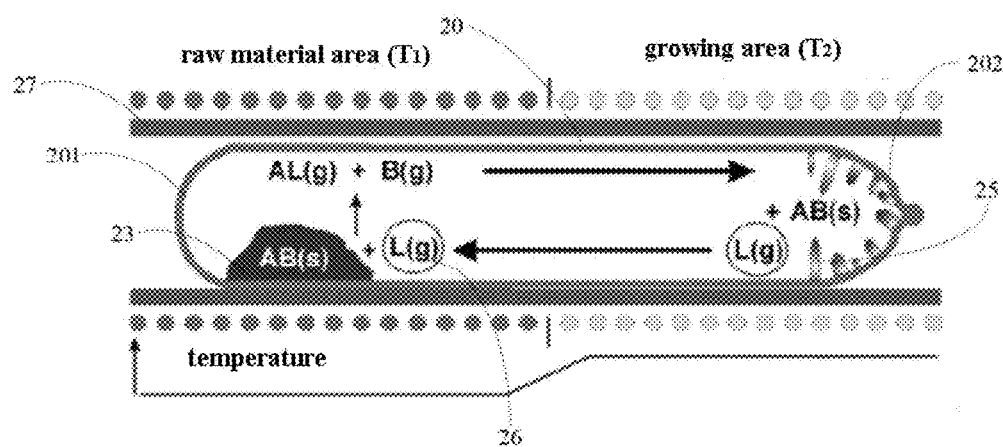
FIG. 15 is a schematic section view of example II of a device for making a semimetal $PtSe_2$.

Referring to FIGS. 14-15, a chemical vapor transport method for making the semimetal $PtSe_2$ comprises following steps:

step (S20), providing a $PtSe_2$ polycrystalline material;

step (S21), placing the $PtSe_2$ polycrystalline material in a reacting chamber 20 as reacting materials 23;

step (S22), placing chemical transport medium 26 in the reacting chamber 20;

step (S23), evacuating the reacting chamber 20 to be vacuum less than 10 Pa;

step (S24), placing the reacting chamber 20 at a temperature gradient, wherein the reacting chamber 20 has a first end 201 at a temperature of about 1200 degrees Celsius to about 1000 degrees Celsius and a second end 202 opposite to the first end 201 and at a temperature of about 1000 degrees Celsius to about 900 degrees Celsius; and step (S25), keeping the reacting chamber 20 in the temperature gradient for 10 days to 30 days to obtain the reaction product 25 at the second end 202.

In FIG. 15, AB represents the element of $PtSe_2$, and L represents the element of the chemical transport medium 26.

Figure 19:
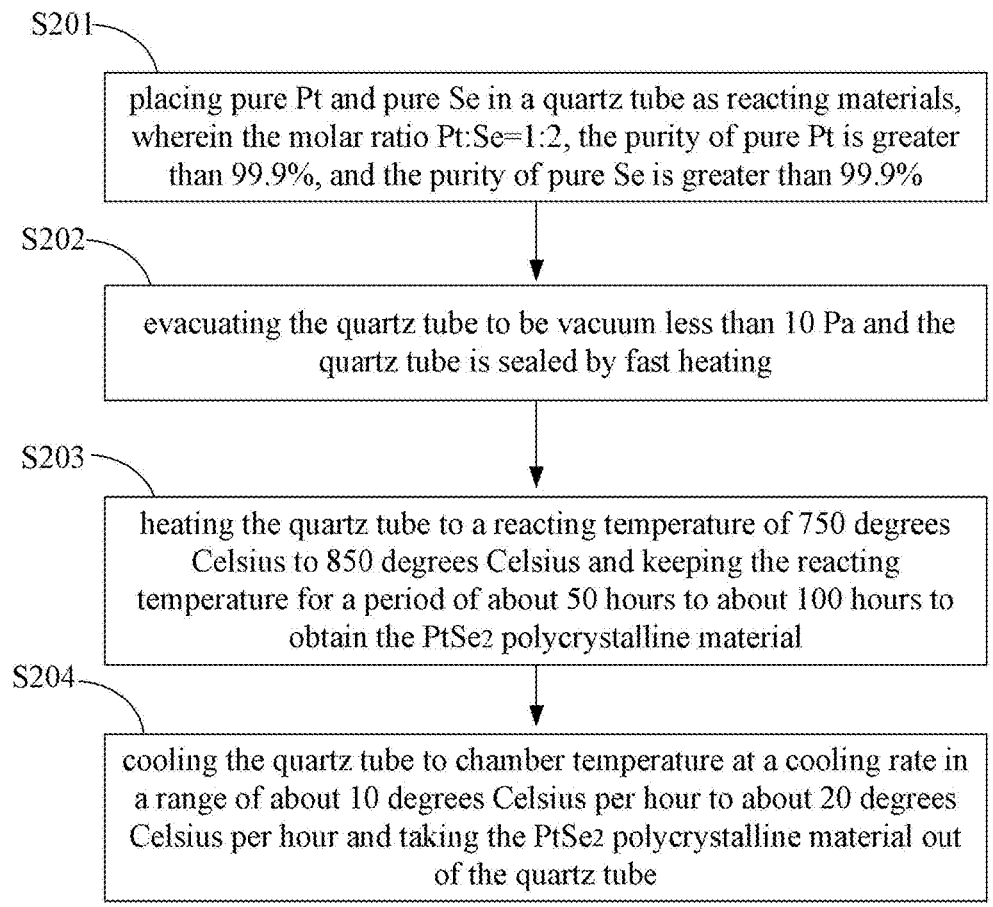
FIG. 19 is a flowchart of example II of a method for making a $PtSe_2$ polycrystalline material.

In step (S20), the $PtSe_2$ polycrystalline material can be provided by any method. In one embodiment, as shown in FIG. 19, the $PtSe_2$ polycrystalline material is made by following steps:

step (S201), placing pure Pt and pure Se in a quartz tube as reacting materials, wherein the molar ratio Pt:Se=1: 2, the purity of pure Pt is greater than 99.9%, and the purity of pure Se is greater than 99.9%;

step (S202), evacuating the quartz tube to be vacuum less than 10 Pa and the quartz tube is sealed by fast heating;

step (S203), heating the quartz tube to a reacting temperature of 750 degrees Celsius to 850 degrees Celsius and keeping the reacting temperature for a period of about 50 hours to about 100 hours to obtain the $PtSe_2$ polycrystalline material; and step (S204), cooling the quartz tube to chamber temperature at a cooling rate in a range of about 10 degrees Celsius per hour to about 20 degrees Celsius per hour and taking the $PtSe_2$ polycrystalline material out of the quartz tube.

In step (S204), the $PtSe_2$ remains polycrystalline because the cooling rate is higher than 10 degrees Celsius per hour.

In step (S21), the reacting chamber 20 is a quartz tube having an open end and a sealed end opposite to the open end. The inner diameter of the quartz tube is about 8 millimeters, and the outer diameter of the quartz tube is about 10 millimeters. The reacting materials 23 are located at the sealed end of the quartz tube.

In step (S22), the chemical transport medium 26 can be located adjacent to the reacting materials 23. The chemical transport medium 26 can be $SeBr_4$, $I_2$, $Br_2$, $Cl_2$, $SeCl_4$. The concentration of the chemical transport medium 26 can be in a range of about 5 mg/mL to about 20 mg/mL. In one embodiment, the chemical transport medium 26 is $SeBr_4$ with a concentration 10 mg/mL.

In step (S23), the quartz tube is evacuated and sealed by fast heating as described above. The pressure of the quartz tube can be lower than 1 Pa.

In step (S24), the quartz tube is horizontally located in the tubular furnace 27. The reacting materials 23 are located at the first end 201 of the quartz tube. The temperature of the first end 201 is higher than the temperature of the second end 202 so that the temperature gradient is formed between the first end 201 and the second end 202. In one embodiment, the first end 201 of the quartz tube is heated by the tubular furnace 27 to a point where the inside thereof reaches 1050 degrees Celsius, and the second end 202 of the quartz tube is heated by the tubular furnace 27 to a point where the inside thereof reaches 970 degrees Celsius.

In step (S25), the reaction product 25 can be obtained at the second end 202 of the quartz tube after keeping the temperature gradient for 10 days to 30 days. The reaction product 25 is taken out of the quartz tube and washed using alcohol to remove the chemical transport medium to obtain pure crystal material of $PtSe_2$. In one embodiment, the reacting chamber 20 is kept in the temperature gradient for 20 days.

Figure 16:
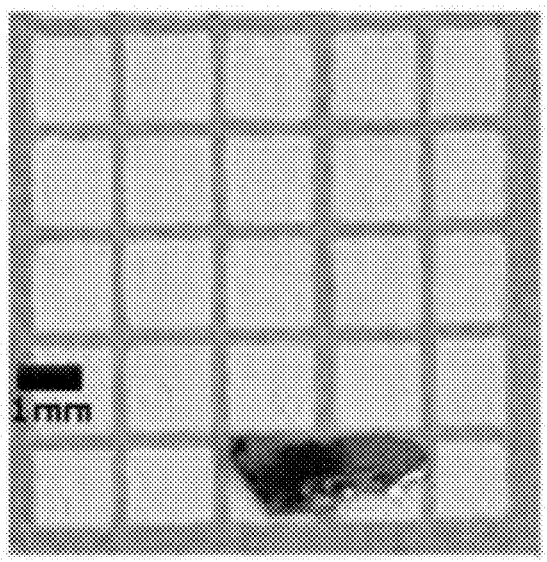
FIG. 16 is a photo image of the semimetal $PtSe_2$ of example II.
Figure 17:
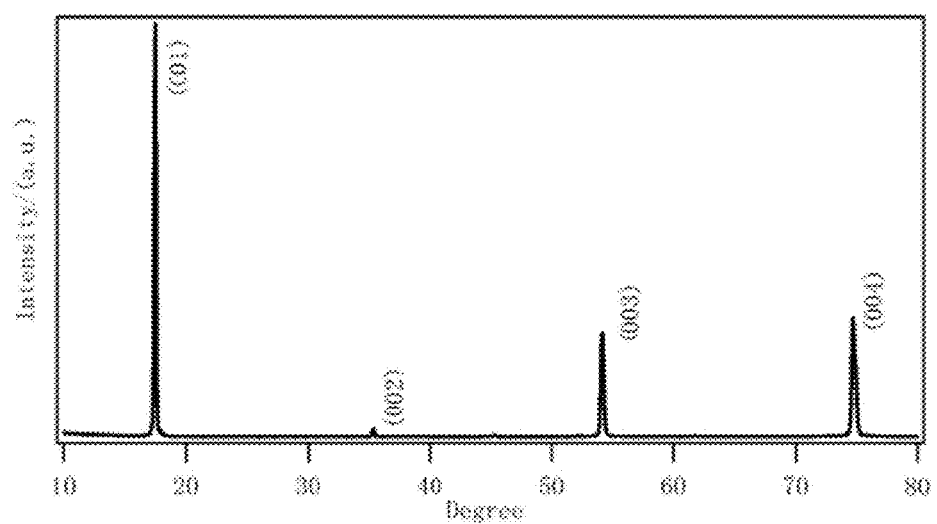
FIG. 17 is an X-ray diffraction (XRD) result of the semimetal $PtSe_2$ of example II measured at room temperature.
Figure 18:
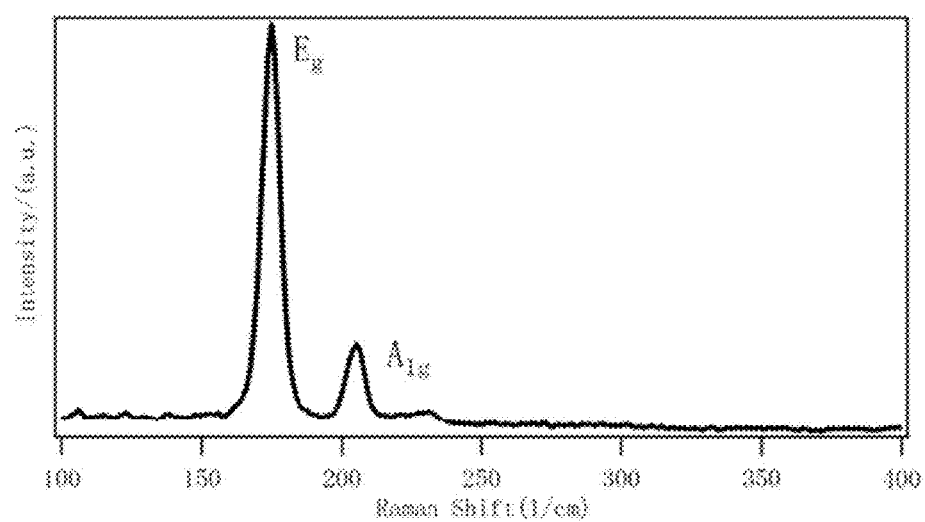
FIG. 18 is a Raman spectrum result of the semimetal $PtSe_2$ of example II measured at room temperature.

The pure crystal material of $PtSe_2$ of example II is tested. FIG. 16 is a photo image of the semimetal $PtSe_2$ of example II. As shown in FIG. 16, the semimetal $PtSe_2$ of example II is macroscopic visible and has a size about 2 millimeters. FIG. 17 is a XRD result of the semimetal $PtSe_2$ of example II measured at room temperature. FIG. 18 is a Raman spectrum result of the semimetal $PtSe_2$ of example II measured at room temperature. As shown in FIG. 17, the semimetal $PtSe_2$ of example II confirm the high quality of the single crystals. The Raman spectrum in FIG. 18 shows Eg and A1g vibrational modes of the semimetal $PtSe_2$ of example I at about 170 cm$^{-1}$ and 210 cm$^{-1}$ respectively, which are typical for 1T structure. It is experimentally and theoretically confirmed that the semimetal $PtSe_2$ of example II belong to Type-II Dirac semimetals.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making semimetal compound of Pt, the method comprising:

provi ding a quartz tube having an open end and a sealed end opposite to the open end;

filling quartz slag in the quartz tube so that the quartz slag to form a support at the sealed end;

filling quartz wool in the quartz tube so that the quartz wool to form a filter on the quartz slag;

placing Pt and Se in the quartz tube as reacting materials, wherein a first purity of the Pt is greater than 99.9%, and a second purity of the Se is greater than 99.99%;

evacuating the quartz tube to be vacuum with a pressure lower than 10 Pa;

sealing the open end;

vertically accommodating the quartz tube in a steel sleeve so that the reacting materials is located at a bottom of the quartz tube and the quartz slag and the quartz wool are located at a top of the quartz tube;

heating the steel sleeve to a first temperature of 600 degrees Celsius to 800 degrees Celsius and keeping the first temperature for a first period of 24 hours to 100 hours;

cooling the steel sleeve to a second temperature of 400 degrees Celsius to 500 degrees Celsius and keeping the second temperature for a second period of 24 hours to 100 hours at a cooling rate of 1 degrees Celsius per hour to 10 degrees Celsius per hour to obtain a reaction product comprising a crystal material of $PtSe_2$; and separating the crystal material of $PtSe_2$ from the reaction product by reversing the steel sleeve.

2. The method of claim 1, wherein a molar ratio of Pt element and Se element is from 2:80 to 2:120.

3. The method of claim 2, wherein the molar ratio of Pt element and Se element is 2:98.

4. The method of claim 1, wherein the pressure is lower than 1 Pa.

5. The method of claim 1, wherein the sealing the open end comprises fast heating the open end by a flame.

6. The method of claim 1, wherein the vertically accommodating the quartz tube in the steel sleeve comprises filling fire-resistant cotton between the quartz tube and the steel sleeve.

7. The method of claim 1, wherein the separating the crystal material of $PtSe_2$ from the reaction product further comprises centrifuging the reaction product.

8. The method of claim 7, wherein a period of the centrifuging the reaction product is in a range from a minute to 5 minutes, and a speed of the centrifuging the reaction product is in a range of 2000 rpm to 3000 rpm.

* * * * *